United States Patent
Jefremow et al.

(10) Patent No.: US 10,236,041 B2
(45) Date of Patent: Mar. 19, 2019

(54) DETERMINING A STATE OF A MEMORY CELL

(71) Applicant: Infineon Technologies AG, Neubiberg (DE)

(72) Inventors: Mihail Jefremow, Augsburg (DE); Thomas Kern, Ascheim (DE); Christian Peters, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/597,846

(22) Filed: May 17, 2017

(65) Prior Publication Data
US 2018/0190333 A1      Jul. 5, 2018

(30) Foreign Application Priority Data

May 31, 2016   (DE) .................. 10 2016 110 049

(51) Int. Cl.
| | | |
|---|---|---|
| *G11C 7/22* | (2006.01) | |
| *G11C 7/06* | (2006.01) | |
| *G11C 13/00* | (2006.01) | |
| *G11C 16/26* | (2006.01) | |
| *G11C 16/28* | (2006.01) | |
| *G11C 16/32* | (2006.01) | |

(52) U.S. Cl.
CPC ................. *G11C 7/22* (2013.01); *G11C 7/06* (2013.01); *G11C 7/065* (2013.01); *G11C 13/004* (2013.01); *G11C 16/26* (2013.01); *G11C 16/28* (2013.01); *G11C 7/067* (2013.01); *G11C 13/0061* (2013.01); *G11C 16/32* (2013.01); *G11C 2013/0045* (2013.01); *G11C 2013/0054* (2013.01); *G11C 2013/0057* (2013.01); *G11C 2207/063* (2013.01); *G11C 2207/068* (2013.01); *G11C 2213/79* (2013.01)

(58) Field of Classification Search
CPC .................................... G11C 7/22; G11C 7/08
USPC .............................................. 365/189.07, 205
See application file for complete search history.

(56) References Cited

U.S. PATENT DOCUMENTS

| | | | | |
|---|---|---|---|---|
| 5,726,936 | A * | 3/1998 | Whitfield | G11C 16/16 365/185.23 |
| 5,880,999 | A * | 3/1999 | Ansel | G11C 11/005 365/104 |
| 6,154,064 | A * | 11/2000 | Proebsting | G11C 7/062 327/55 |
| 6,501,697 | B1 * | 12/2002 | Perner | G11C 7/062 365/148 |
| 6,529,398 | B1 * | 3/2003 | Nair | G11C 11/22 365/145 |

(Continued)

OTHER PUBLICATIONS

German Patent Office, Office Action issued for DE 102016110049. 8, 5 pgs., dated Feb. 2, 2017.

*Primary Examiner* — Michael Tran
(74) *Attorney, Agent, or Firm* — Schiff Hardin LLP

(57) ABSTRACT

A method is suggested for determining a state of a memory cell via a sense amplifier the method including applying a first signal to the sense amplifier; sensing a first response; determining a reference signal based on the first signal; sensing a second response based on a second signal that is determined based on the first signal; and determining the state of the memory cell based on the second response and the reference signal. Also, a memory device that is able to determine the state of the memory cell is provided.

17 Claims, 10 Drawing Sheets

(56) References Cited

U.S. PATENT DOCUMENTS

| | | | | |
|---|---|---|---|---|
| 7,161,861 B2* | 1/2007 | Gogl | G11C 5/145 | 365/205 |
| 7,852,665 B2* | 12/2010 | Chen | G11C 7/062 | 365/148 |
| 9,196,358 B2* | 11/2015 | Lee | G11C 13/004 | |
| 9,368,201 B2* | 6/2016 | Park | G11C 11/5642 | |
| 9,390,793 B1* | 7/2016 | Nigam | G11C 13/004 | |
| 9,496,046 B1* | 11/2016 | Jin | G11C 16/28 | |
| 2004/0266107 A1* | 12/2004 | Chindalore | B82Y 10/00 | 438/258 |
| 2006/0126387 A1* | 6/2006 | Kim | G11C 11/5642 | 365/185.17 |
| 2007/0025158 A1* | 2/2007 | Kim | G11C 16/12 | 365/185.22 |
| 2007/0159898 A1* | 7/2007 | Lamorey | G11C 11/16 | 365/200 |
| 2008/0165570 A1* | 7/2008 | Happ | G11C 11/5678 | 365/163 |
| 2008/0165592 A1* | 7/2008 | Kitagawa | G11C 11/16 | 365/189.09 |
| 2009/0323403 A1* | 12/2009 | Chen | G11C 11/1673 | 365/158 |
| 2010/0110760 A1 | 5/2010 | Chen et al. | | |
| 2011/0085384 A1* | 4/2011 | Chen | G11C 7/062 | 365/185.21 |
| 2011/0216601 A1* | 9/2011 | Liao | G11C 7/02 | 365/185.21 |
| 2011/0235403 A1* | 9/2011 | Kang | G11C 13/0004 | 365/148 |
| 2012/0182818 A1* | 7/2012 | Huang | G11C 7/067 | 365/203 |
| 2012/0307571 A1* | 12/2012 | Siao | G11C 7/067 | 365/189.07 |
| 2012/0320657 A1* | 12/2012 | Chung | G11C 11/56 | 365/96 |
| 2013/0322156 A1 | 12/2013 | Papandreou et al. | | |
| 2014/0153325 A1* | 6/2014 | Wang | G11C 13/0004 | 365/158 |
| 2014/0177355 A1* | 6/2014 | Kim | G11C 13/0004 | 365/189.15 |
| 2015/0036409 A1* | 2/2015 | Jung | G11C 11/161 | 365/66 |
| 2015/0036421 A1* | 2/2015 | Kim | G11C 11/1673 | 365/158 |
| 2015/0092469 A1* | 4/2015 | Kim | G11C 11/1673 | 365/148 |
| 2015/0294706 A1* | 10/2015 | Bonaccio | G11C 11/1673 | 365/158 |
| 2015/0357035 A1* | 12/2015 | Kim | G11C 13/0033 | 365/148 |
| 2015/0364188 A1* | 12/2015 | Lee | G11C 13/004 | 365/148 |
| 2016/0020389 A1* | 1/2016 | Ratnam | G11C 13/004 | 257/2 |
| 2016/0093373 A1* | 3/2016 | Siau | G11C 13/004 | 365/148 |
| 2016/0111151 A1* | 4/2016 | Yoon | G11C 13/0002 | 365/148 |
| 2016/0125939 A1* | 5/2016 | Park | G11C 11/1673 | 365/148 |
| 2016/0125940 A1* | 5/2016 | Kang | G11C 13/004 | 365/148 |
| 2016/0148685 A1* | 5/2016 | Roy | G11C 13/0069 | 365/148 |
| 2016/0163366 A1* | 6/2016 | Kwon | G11C 5/06 | 365/72 |
| 2016/0172026 A1* | 6/2016 | Lee | G11C 13/004 | 365/148 |
| 2016/0247580 A1* | 8/2016 | Chen | G11C 17/18 | |
| 2016/0254060 A1* | 9/2016 | Pi | G11C 7/062 | 365/185.21 |
| 2016/0293240 A1* | 10/2016 | Fukuzawa | G11C 11/1673 | |
| 2016/0293252 A1* | 10/2016 | Ogiwara | G11C 13/0004 | |
| 2017/0186472 A1* | 6/2017 | Jan | G11C 11/1673 | |
| 2018/0005678 A1* | 1/2018 | Foong | G11C 11/1673 | |

* cited by examiner

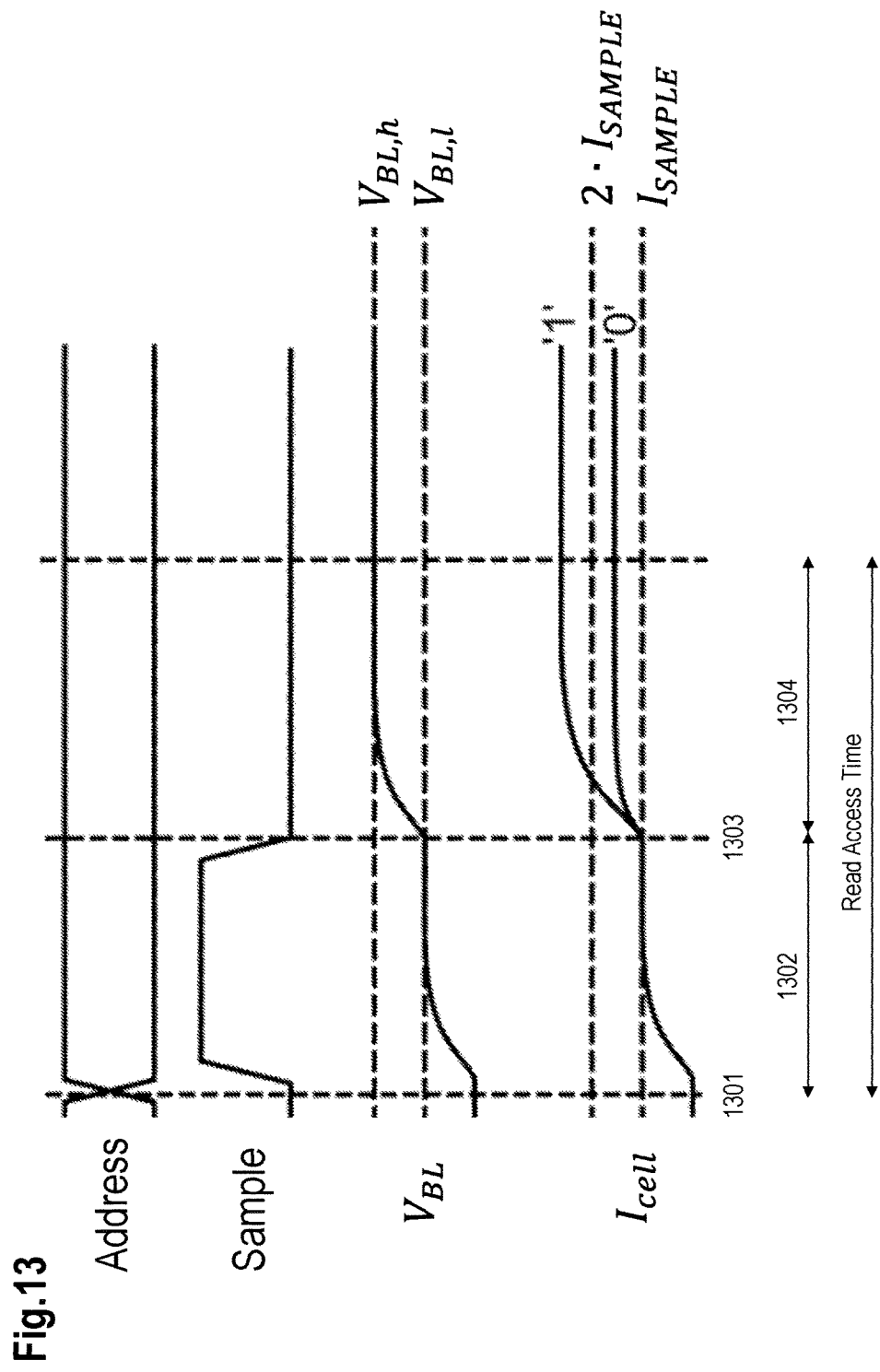

DETERMINING A STATE OF A MEMORY CELL

BACKGROUND OF THE INVENTION

Embodiments of the present invention relate to memory cells and memory devices, in particular to non-volatile memories (NVMs).

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

FIG. 13 shows a timing diagram of various signals of the circuit as depicted in FIG. 12.

DETAILED DESCRIPTION OF THE PREFERRED EMBODIMENTS

Examples described herein in particular relate to a reading operation of a memory, in particular a memory array. The reading operation is also referred to as "sensing".

For reading a memory, e.g., a memory cell of the memory array or several memory cells of the memory array, a reading circuit is provided (comprising a sense amplifier) which detects a state of the memory cell and generates a digital output signal based on this memory cell state detected. The memory cell state may be a high or low resistive cell state.

A robustness of the sensing is based on a resistance difference of the memory cell, i.e. a difference between a high resistive memory cell state and a low resistive memory cell state. This difference is also referred to as "window" or "cell window". It is noted that instead of the term "memory cell" also the shortened term "cell" is used.

The memory (array) may comprise a large number of memory cells. The cells of the memory exhibit a distribution of high and low resistive cell states among the memory cells, e.g., due to manufacturing tolerances and effects.

Due to technology scaling and fluctuations in manufacturing the process(es) the cell window may decrease.

Program erase cycles degrade the cell window of charge based memories or resistive memories. In memory technologies like MRAM or RRAM it may already be difficult to reach a sufficiently large cell window for megabit memories.

Conventional sensing schemes require a cell window to distinguish the two cell states of the memory cells in the memory array.

Figure 1:
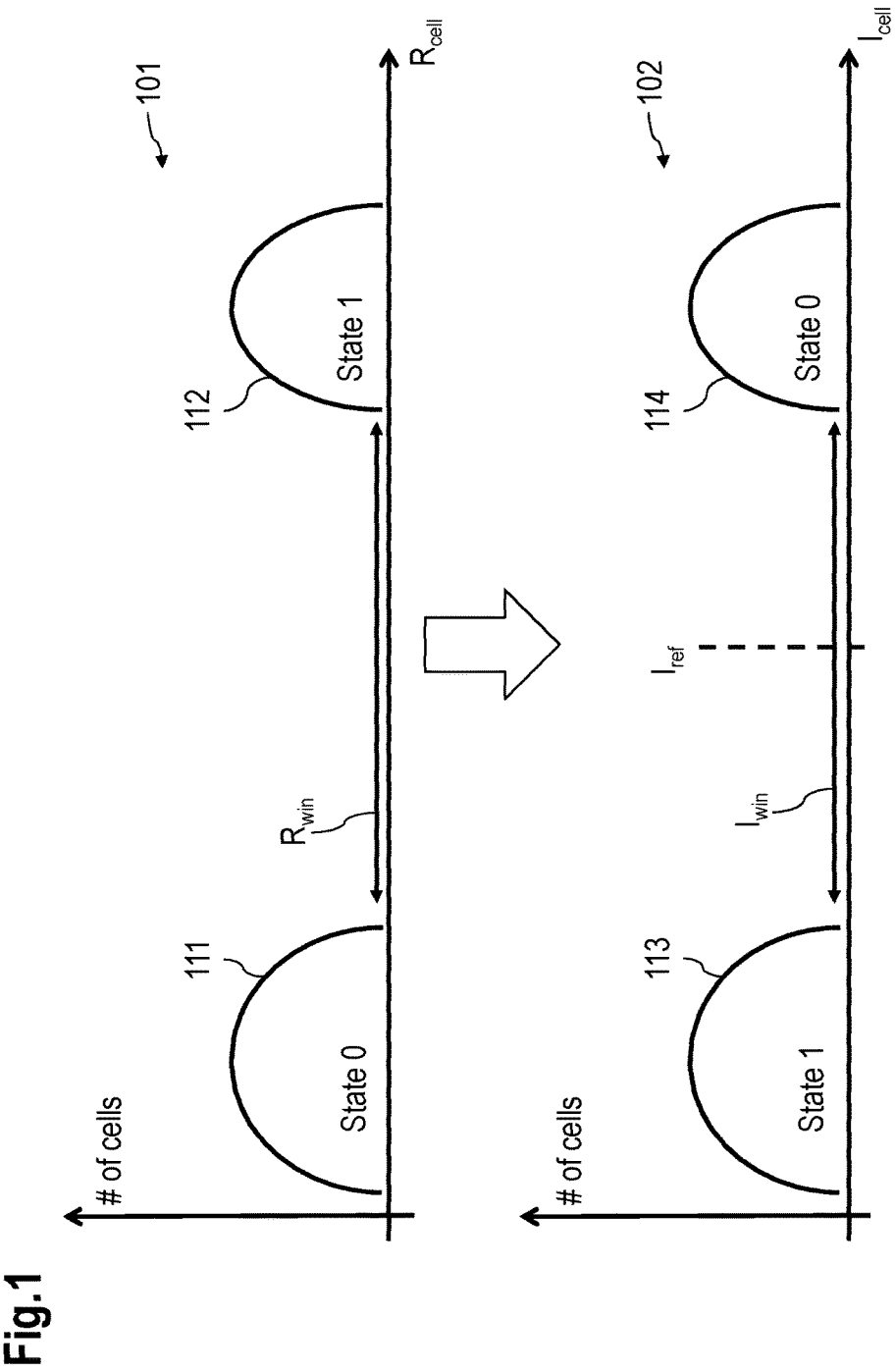
FIG. 1 shows two graphs illustrating a sensing scheme.

FIG. 1 depicts two graphs 101 and 102 illustrating a sensing scheme. The graph 101 shows a distribution 111 of resistance values ($R_{cell}$) of cells that are in a state 0 and a distribution 112 of resistance values of cells that are in a state 1. A difference between the distribution 111 and 112 is referred to as a resistive cell window $R_{win}$.

The graph 102 shows a distribution 113 of cell current ($I_{cell}$) values of cells that are in the state 1 and a distribution 114 of cell current values of cells that are in the state 0. A difference between the distribution 113 and 114 is referred to as a current window $I_{win}$.

The cell current $I_{cell}$ is determined for a fixed bitline voltage $V_{BL}$. The distribution 111 corresponds to the distribution 114 and the distribution 112 corresponds to the distribution 113. Hence, the cell current shown in graph 102 corresponds to the cell resistance shown in graph 101, i.e. current sensing can be used to determine the cell resistance. In order to distinguish the cell states 0 and 1, current sensing in combination with a reference current $I_{ref}$ is applied. For example, a state 0 can be assumed if the cell current is below the reference current $I_{ref}$ and the state 1 can be assumed if the cell current is above the reference current $I_{ref}$. As an option, a current, e.g., an absolute value of the cell current at a fixed bias may be compared with the reference current $I_{ref}$ to determine whether a cell is in either the state 0 or the state 1.

It is noted that the states 0 and 1 are exemplary states. It is an option to exchange these states or utilize different states. It is also an option to utilize more than two states.

Figure 2:
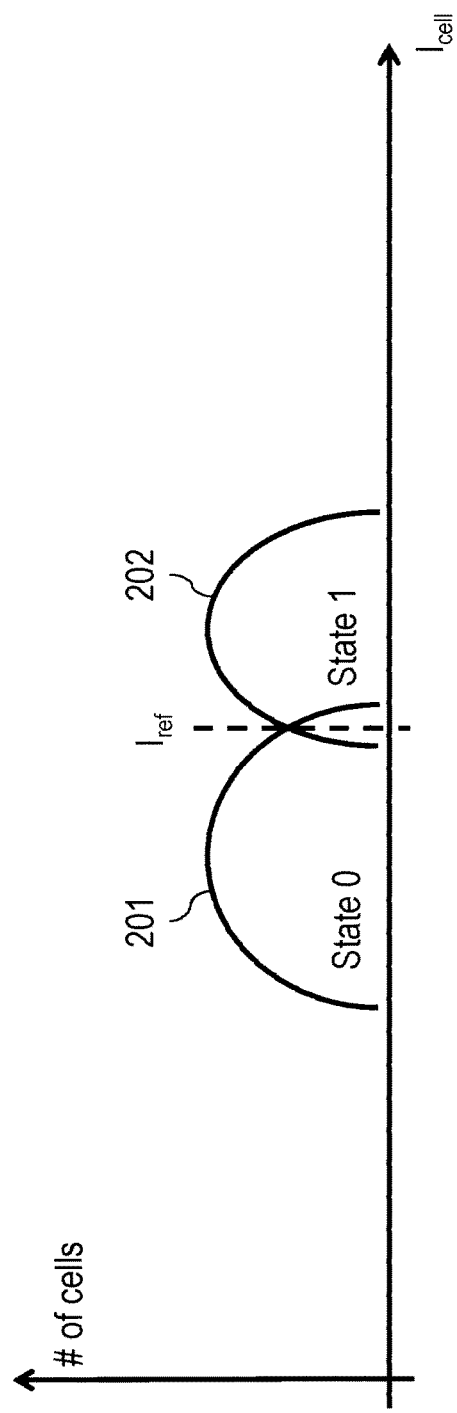
FIG. 2 shows an exemplary diagram based on FIG. 1, wherein cell current distributions overlap and the reference current falls within the overlap area.

FIG. 2 shows an exemplary diagram based on graph 102: a distribution 201 of cell currents ($I_{cell}$) shows values of cells that are in the state 0 and a distribution 202 of cell currents shows values of cells that are in the state 1. In this example, the distributions 201 and 202 overlap and the reference current $I_{ref}$ falls within the overlap area.

This may be a result of memory cell properties, technology scaling, fluctuations in manufacturing processes and cycling of the memory cells; all these contribute to the fact that the current window $I_{win}$ get significantly reduced. If the current window $I_{win}$ approximates, or reaches zero, the separation between the states 0 and 1 results in an increasing number of errors.

Figure 3:
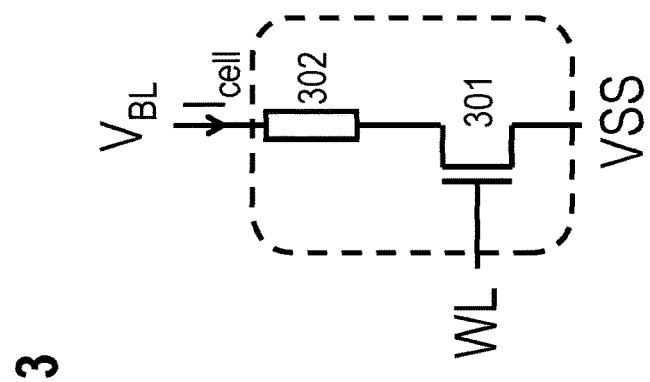
FIG. 3 shows an exemplary non-volatile memory cell.

FIG. 3 shows an exemplary non-volatile memory cell. The cell may in particular be a cell of an MRAM or an RRAM.

The cell comprises an n-channel MOSPET 301 with its gate connected to a WL terminal (WL: word line), its source connected to a negative supply voltage VSS (e.g., ground) and its drain connected via a resistor 302 to a $V_{BL}$ terminal ($V_{BL}$: bitline voltage), which supplies a voltage via a bitline.

Figure 4:
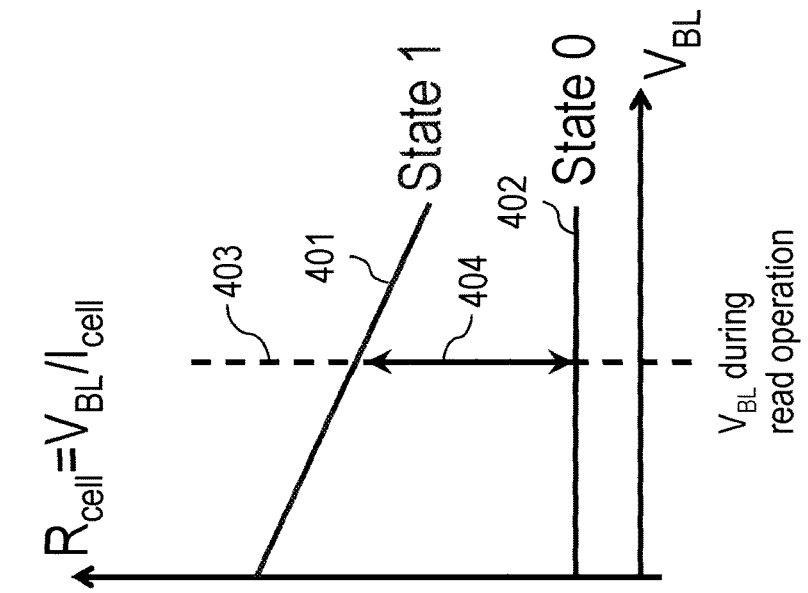
FIG. 4 shows a diagram comprising a cell resistance in view of a bitline voltage for a state 0 and a state 1.

FIG. 4 shows a diagram comprising a graph 401 and a graph 402. The graph 401 depicts the dependency between the cell resistance $R_{cell}$ in case the cell is in the state 1 and the graph 402 depicts the dependency between the cell resistance $R_{cell}$ in case the cell is in the state 0. It is noted that the cell resistance $R_{cell}$ is determined by the bitline voltage $V_{BL}$ and the cell current $I_{cell}$ as follows:

$$R_{cell} = \frac{V_{BL}}{I_{cell}}.$$

If the cell is in the state 1, the cell resistance $R_{cell}$ decreases with an increasing bitline voltage $V_{BL}$. If the cell is in the state 0, the cell resistance $R_{cell}$ is (substantially) constant over the bitline voltage $V_{BL}$.

FIG. 4 also shows a line 403 that indicates a bitline voltage during a read operation. This bitline voltage during the read operation results in a resistance difference 404 which corresponds to the resistive cell window $R_{win}$.

Thus, the non-volatile memory cell shows a voltage dependent ohmic resistance behavior in its high ohmic state (here: the state 1). The memory cell has a nearly constant (voltage independent) resistance in its low ohmic state (here: the state 0).

According to an example, a read method may not only sense an absolute resistance difference of a cell with respect to a reference current for a fixed bias point. In order to distinguish between the state 1 and the state 0, the cell resistance dependency on the cell voltage (linearity of the cell current) may be measured by a sense amplifier circuit as suggested herein and it may be combined with an absolute value reference sensing.

The sense amplifier may detect and/or measure a resistance change of the memory cell with respect to the bitline voltage.

Figure 5:
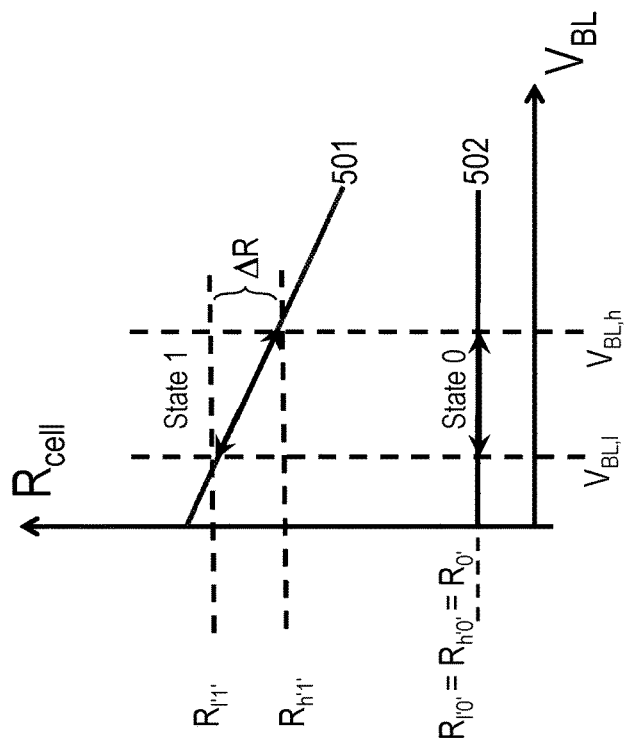
FIG. 5 shows the diagram of FIG. 4 with different bitline voltages.

FIG. 5 shows a diagram with a bitline voltage $V_{BL}$ on the x-axis and the cell resistance $R_{cell}$ on the y-axis.

In particular, the following resistance values are measured:
$R_h$ for a high bitline voltage $V_{BL,h}$ and
$R_l$ for a low bitline voltage $V_{BL,l}$.

If the cell is in the low resistive state 0, indicated by a substantially horizontal line 502, the resistance value $R_{l'0'}$ amounts to the resistance value $R_{h'0'}$. Hence, the change of the cell resistance is (substantially) zero.

If the cell is in the high resistive state 1, indicated by the a line 501 (which in this example is a straight line, but it could also be a non-linear curve), the resistance value at the high bitline voltage $V_{BL,h}$ amounts to $R_{h'1'}$ and the resistance value at the low bitline voltage $V_{BL,l}$ amounts to $R_{l'1'}$. The difference (also referred to as resistance change or cell resistance change)

$$\Delta R = R_{l'1'} - R_{h'1'}$$

is not zero and the resistance value $R_{h'1'}$ is lower than the resistance value $R_{l'1'}$.

If the resistance change $\Delta R$ is larger than a predetermined threshold, the cell is in the state 1, otherwise the cell is in the state 0. The resistance change $\Delta R$ can be detected by the sense amplifier circuit and a digital output signal may be generated to indicate whether the cell is in the state 0 or in the state 1.

Figure 6:
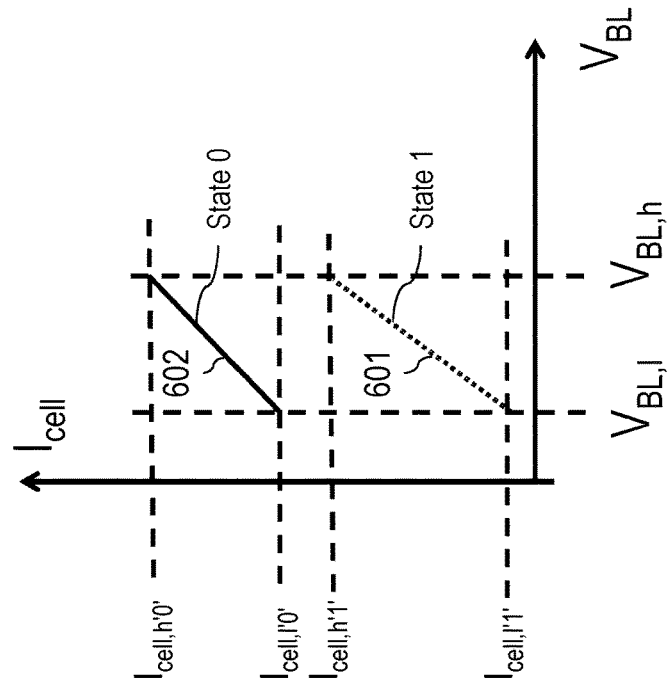
FIG. 6 shows the sensing approach of FIG. 5 transformed in the current domain.

FIG. 6 visualizes the sensing approach of FIG. 5 transformed in the current domain. The diagram of FIG. 6 shows the bitline voltage $V_{BL}$ on the x-axis and a cell current $I_{cell}$ on the y-axis. It is noted that instead of the current domain a voltage or a power domain may be used accordingly.

As shown in FIG. 6, the following cell resistances are obtained for the two bitline voltages $V_{BL,l}$, $V_{BL,h}$:

|  | State 0 | State 1 |
|---|---|---|
| $V_{BL,l}$ | $R_{0'}$ | $R_{l'1'}$ |
| $V_{BL,h}$ | $R_{0'}$ | $R_{h'1'}$ |

It is noted that the cell resistance for the low resistive state 0 amounts to $$R_{0'} = R_{l'1'} = R_{h'0'}.$$

Based on the formula I=U/R, the following cell currents are obtained:

|  | State 0 | State 1 |
|---|---|---|
| $V_{BL,l}$ | $V_{BL,l}/R_{0'} = I_{cell,l'0'}$ | $V_{BL,l}/R_{l'1'} = I_{cell,l'1'}$ |
| $V_{BL,h}$ | $V_{BL,h}/R_{0'} = I_{cell,h'0'}$ | $V_{BL,h}/R_{h'1'} = I_{cell,h'1'}$ |

The four cell current values $I_{cell,l'0'}$, $I_{cell,h'0'}$, $I_{cell,l'1'}$ and $I_{cell,h'1'}$ are shown in the diagram of FIG. 6. This results in an exemplary straight line 601 for the state 1 and a straight line 602 for the state 0. In case the cell resistance is not constant, the line 601 is not a straight line (indicated as dotted line), but a curve (which is also an option).

In the current domain, a resistance change can be determined by current or voltage monitoring. In the example of FIG. 6, the resistance change is determined by sensing the cell current at two different bitline voltages. This, allows determining whether the cell is in the state 0 or in the state 1.

It is also an option that instead of using the bitline voltages $V_{BL,l}$ and $V_{BL,h}$, a current could be used for biasing purposes.

Figure 7:
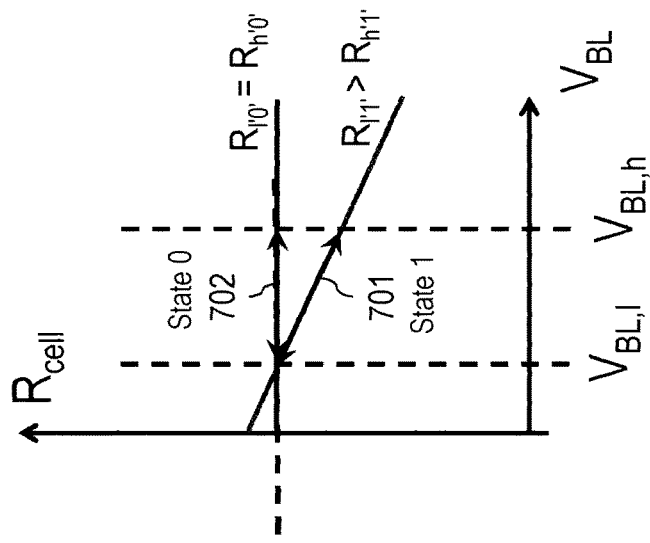
FIG. 7 shows an exemplary diagram based on FIG. 5, wherein the cell resistance of the cell being in the state 1 is below the cell resistance of the cell being in the state 0.

FIG. 7 shows an exemplary diagram based on the diagram of FIG. 5, wherein the cell resistance of the cell being in the state 1 is below the cell resistance of the cell being in the state 0. A line 702 shows the state 0 and a line 701 shows the state 1.

Figure 8:
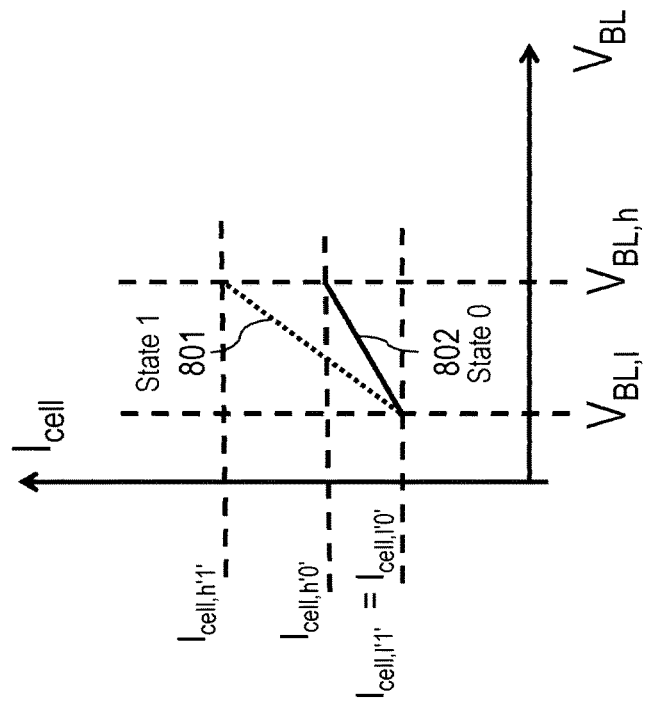
FIG. 8 shows how the resistances of FIG. 7 are transformed to cell currents $I_{cell,l'0'}$, $I_{cell,h'0'}$, $I_{cell,l'1'}$ and $I_{cell,h'1'}$.

FIG. 8 shows how the resistances of FIG. 7 are transformed to cell currents $I_{cell,l'0'}$, $I_{cell,h'0'}$, $I_{cell,l'1'}$ and $I_{cell,h'1'}$. A line 802 shows the state 0 and a line 801 shows the state 1. The dotted line 801 indicates that instead of a straight line, single non-linear values of the cell resistance might result in a non-linear curve for the cell current $I_{cell}$.

Hence, even if the resistance value of the cell state 1 is below the resistance value of the cell state 0, both cell states can be properly distinguish in the current domain, because of the varying slopes of the lines 801 and 802.

This relative sensing utilizing different bitline voltages (differential approach) is beneficial over an absolute sensing approach, which may not be able to provide proper results in such use case scenario.

Figure 9:
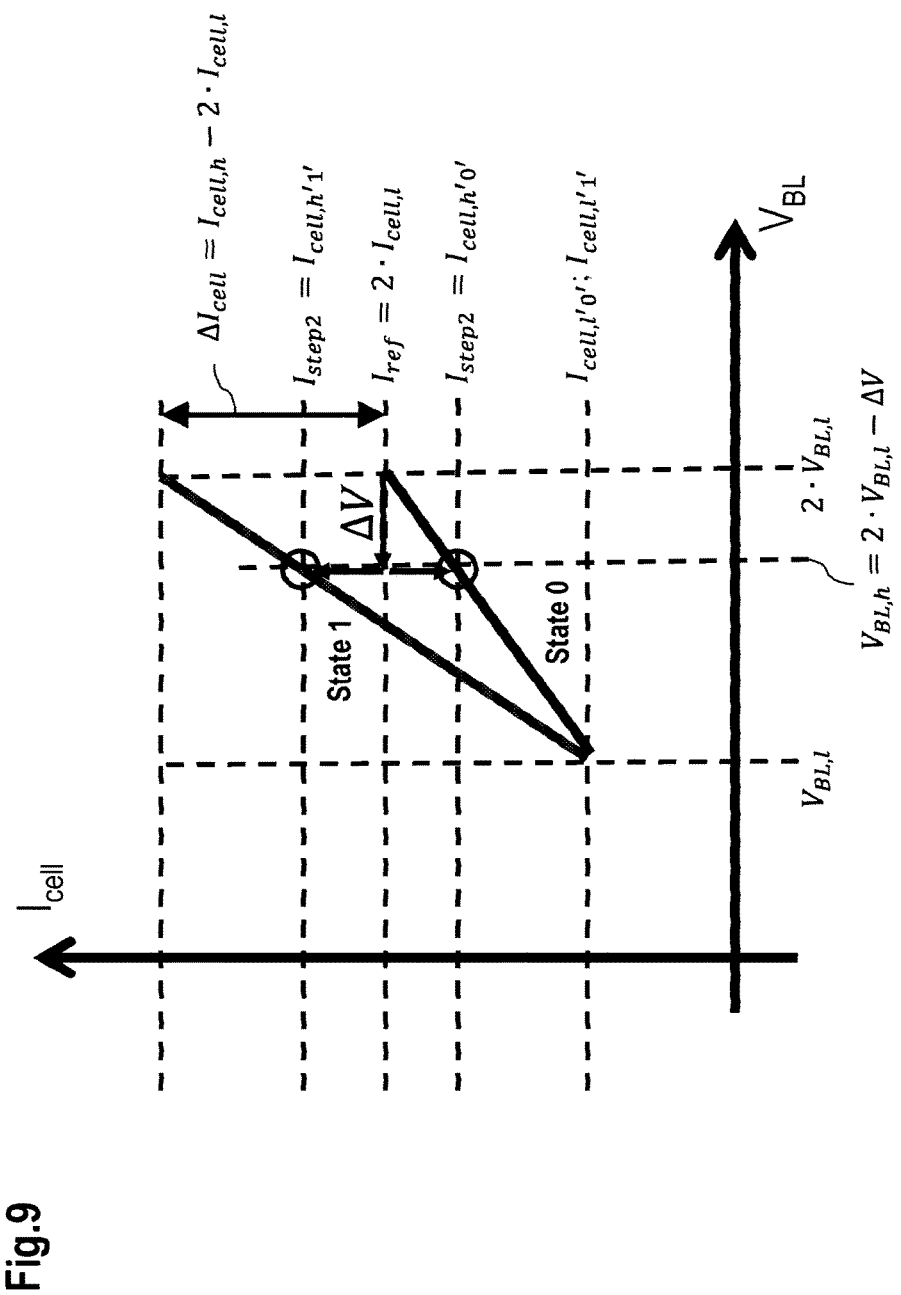
FIG. 9 shows a diagram depicting the cell current $I_{cell}$ over the bitline voltage $V_{BL}$ for illustrating a sensing algorithm.

Exemplary Sensing Algorithm:

FIG. 9 shows a diagram depicting the cell current $I_{cell}$ over the bitline voltage $V_{BL}$. The sensing algorithm may be applied as follows:

Step 1: A reference current $I_{ref}$ is determined as follows:
A low bitline voltage $V_{BL,l}$ is applied and a low cell current $I_{cell,l}$ is sensed at this low bitline voltage $V_{BL,l}$. The low cell current $I_{cell,l}$ is indicated as $I_{cell,l'0'} = I_{cell,l'1'}$ in FIG. 9.
The obtained cell current $I_{cell,l}$) is multiplied with a factor c, in this example multiplied by c=2. This results in the reference current amounting to:

$$I_{ref} = c \cdot I_{cell,l} = 2 \cdot I_{cell,l}.$$

Step 2: A cell current $I_{step2}$ is sensed, which corresponds to the high cell resistance value $R_h$. The cell current $I_{step2}$ is sensed at a bitline voltage amounting to $$V_{BL,h} = c \cdot V_{BL,l} - \Delta V = 2 \cdot V_{BL,l} - \Delta V.$$

The cell current $I_{step2}$ may be either the cell current $I_{cell,h'0'}$ that shows that the cell is in the state 0 or the cell current $I_{cell,h'1'}$ that shows that the cell is in the state 1.

The voltage difference $\Delta V$ may be set to have substantially equal margins between the reference current $I_{ref}$ and the cell currents $I_{cell,h'0'}$ and $I_{cell,h'1'}$ of state 0 and state 1.

Step 3: The cell current $I_{step2}$ is compared with the reference current $I_{ref}$ to determine whether the cell is in the state 0 or in the state 1:

If $I_{step2} > I_{ref}$ then the cell state 1 is determined; in this case, the current increase that stems from the resistance reduction $\Delta R$ based on the voltage difference $\Delta V$ and based on the increased bitline voltage $V_{BL,h}$ is higher than c=2.

If $I_{step2} < I_{ref}$ then the cell state 0 is determined. As the cell state 0 has a constant cell resistance $R_0$, the following applies:

Reference current:

$$I_{ref} = 2 \cdot I_{cell,l} = \frac{2 \cdot V_{BL,l}}{R_0};$$

Cell current at Step 2 when the memory cell is in state 0:

$$I_{step2,0} = \frac{1}{R_0} \cdot V_{BL,h} = \frac{1}{R_0} \cdot (2 \cdot V_{BL,l} - \Delta V) = \frac{2 \cdot V_{BL,l}}{R_0} - \frac{\Delta V}{R_0}.$$

Hence, the cell current $I_{step2,0}$ at the Step 2 is lower than the reference current $I_{ref}$.

Figure 10:
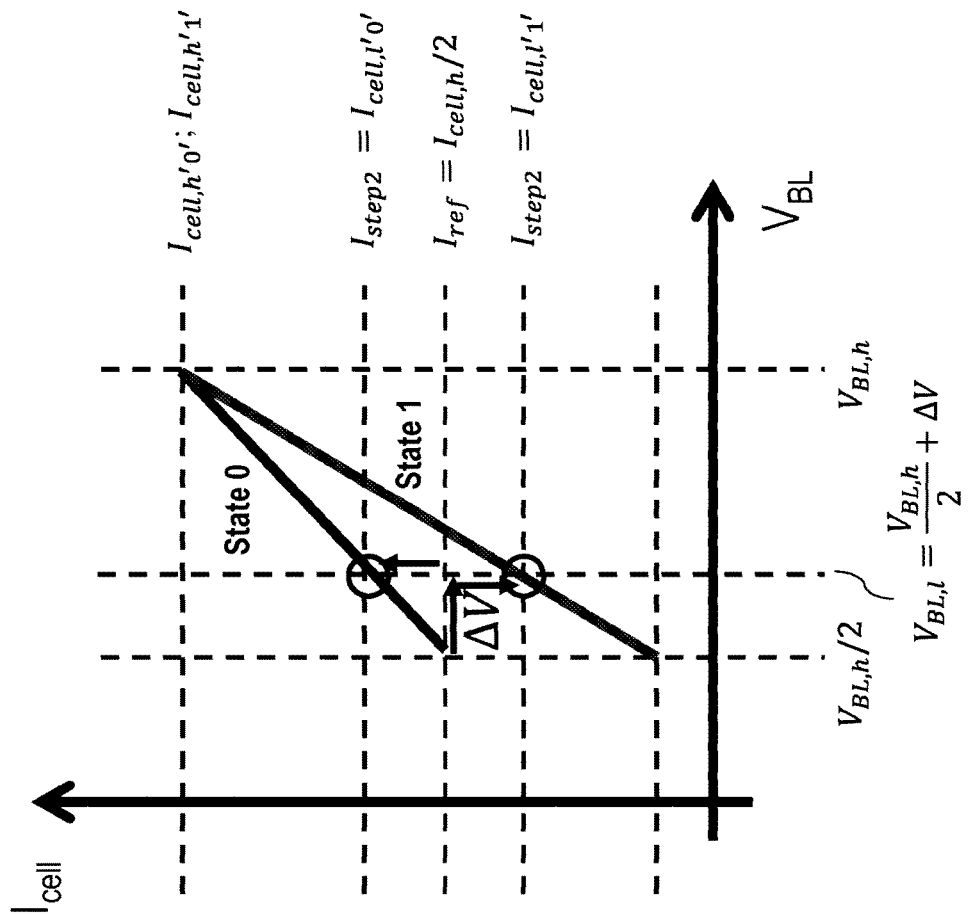
FIG. 10 shows a diagram depicting the cell current $I_{cell}$ over the bitline voltage $V_{BL}$ for illustrating an alternative sensing algorithm.

Alternative Sensing Algorithm:

FIG. 10 shows a diagram depicting the cell current $I_{cell}$ over the bitline voltage $V_{BL}$. The alternative sensing algorithm may be applied as follows:

Step 1: A reference current $I_{ref}$ is determined as follows:

A high bitline voltage $V_{BL,h}$ is applied and a high cell current $I_{cell,h}$ is sensed at this high bitline voltage $V_{BL,h}$. The high cell current $I_{cell,h}$ is indicated as $I_{cell,h'0'} = I_{cell,h'1'}$ in FIG. 9.

The obtained cell current $I_{cell,h}$ is divided by a factor c, in this example divided by c=2. This results in the reference current amounting to:

$$I_{ref} = I_{cell,h} : c = I_{cell,h} : 2.$$

Step 2: A cell current $I_{step2}$ is sensed, which corresponds to the low cell resistance value $R_1$. The cell current $I_{step2}$ is sensed at a bitline voltage amounting to $$V_{BL,h} = \frac{V_{BL,h}}{c} + \Delta V = \frac{V_{BL,h}}{2} + \Delta V.$$

The cell current $I_{step2}$ may be either the cell current $I_{cell,l'0'}$ that shows that the cell is in the state 0 or the cell current $I_{cell,l'1'}$ that shows that the cell is in the state 1.

The voltage difference $\Delta V$ may be set to have substantially equal margins between the reference current $I_{ref}$ and the cell currents $I_{cell,l'0'}$ and $I_{cell,l'1'}$ of state 0 and state 1.

Step 3: The cell current $I_{step2}$ is compared with the reference current $I_{ref}$ to determine whether the cell is in the state 0 or in the state 1:

If $I_{step2} > I_{ref}$ then the cell state 0 is determined.
If $I_{step2} < I_{ref}$ then the cell state 1 is determined.

Exemplary Embodiment: Outlier Cells

Figure 11:
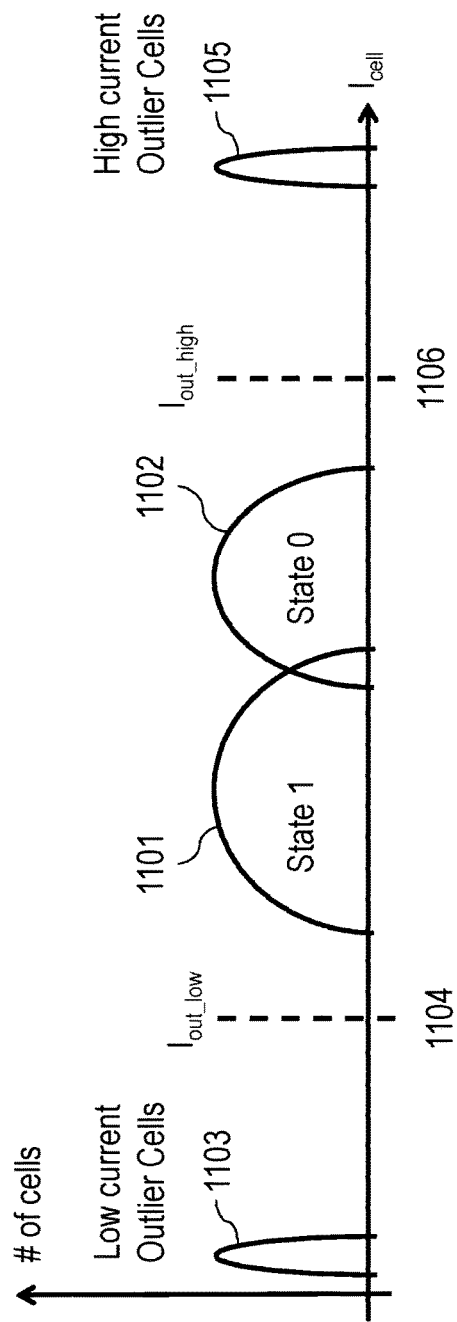
FIG. 11 shows a diagram comprising a distributions of cell currents with current values of cells that are in the state 1, the state 0 and of outlier cells that are also in the state 1.

FIG. 11 shows a diagram comprising a distribution 1101 of cell currents ($I_{cell}$) with current values of cells that are in the state 1 and a distribution 1102 of cell currents with current values of cells that are in the state 0. In this example, the distributions 1101 and 1102 overlap. In addition, a smaller current distribution 1103 comprises current values of outlier cells (e.g., by a contact being open) and a higher current distribution 1105 comprises values of outlier cells (e.g., due to a short).

These outlier cells may be memory cells with a low cell current (e.g., $I_{cell} < 1$ µA) or memory cells with a high cell current (e.g., $I_{cell} > 100$ µA) and may result in read fails of linear sensing approaches. Also, outlier cells lead to accuracy errors of the sense circuit.

As an exemplary approach to mitigate the problem arising from such outlier cells, an absolute level sensing may be combined deploying absolute current thresholds with the relative sensing described above.

For example, the stored reference current $I_{ref}$ can be compared with an absolute current threshold 1104 ($I_{out\_low} = 1$ µA) to separate the distribution 1103 from the distributions 1101 and 1102. To separate the higher current distribution 1105 from the distributions 1101 and 1102, the stored reference current $I_{ref}$ can be compared with an absolute current threshold 1106 ($I_{out\_high}$).

Exemplary Embodiment for a Sense Amplifier

Figure 12:
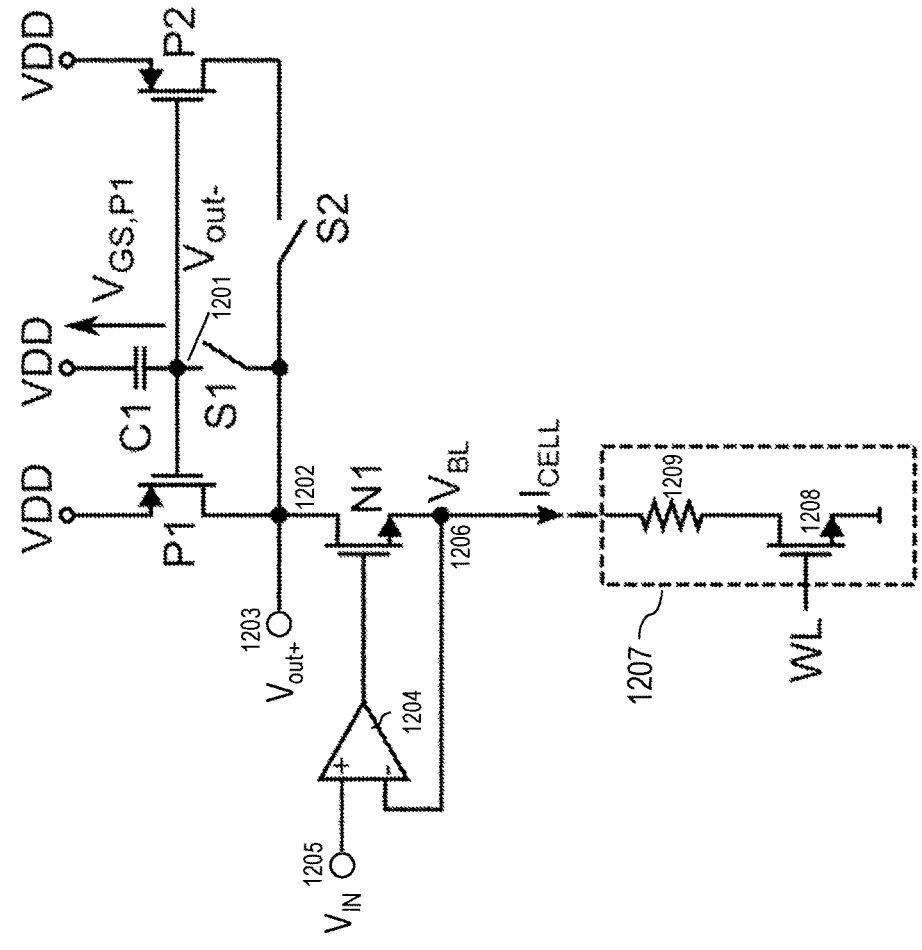
FIG. 12 shows an exemplary circuit diagram of a sense amplifier that relates to the algorithms according to FIG. 9.

FIG. 12 shows an exemplary circuit diagram of a sense amplifier that relates to the algorithms explained above with regard to FIG. 9.

A positive supply voltage VDD is conveyed to the source of a p-channel MOSFET P1 and to the source of a p-channel MOSFET P2. The gates of the MOSFETs P1 and P2 are connected with each other and to a node 1201. The node 1201 is connected across a capacitor C1 to the supply voltage VDD.

The node 1201 is connected across a switch S1 to a node 1202. The node 1202 is connected to a terminal 1203 at which a voltage $V_{out+}$ is supplied. The node 1202 is connected via a switch S2 to the drain of the MOSFET P2. The drain of the MOSFET P1 is connected to the node 1202.

The MOSFET P1 samples (when the switch S1 is closed) and holds (when the switch S1 is opened) the cell current $I_{cell}$. The MOSFET P2 is a voltage-controlled current source that delivers the cell current $I_{cell}$ to the node 1202 if the switch S2 is closed. In this example, the MOSFETs P1 and P2 may be identical.

The node 1202 is connected to the drain of an n-channel MOSFET N1. The output of an operational amplifier 1204 is connected to the gate of the MOSFET N1. The negative input of the operational amplifier 1204 is connected to the source of the MOSFET N1. The positive input of the operational amplifier 1204 is connected to a terminal 1205 to which a voltage $V_{IN}$ is supplied.

The source of the MOSFET N1 is connected to a node 1206. Between the node 1206 and ground, the bitline voltage $V_{BL}$ could be determined. The cell current $I_{cell}$ of a memory cell 1207 is sourced from the node 1206. The memory cell comprises an n-channel MOSFET 1208 with its gate connected to a word line WL, its source connected to ground (VSS) and its drain connected to the node 1206 via a resistor 1209.

The switches S1 and S2 are electronic switches, which can be controlled by a control unit (not shown). The switches S1 and S2 may in particular be transistors.

The bitline voltage $V_{BL}$ is regulated by the operational amplifier 1204 adjusting the gate voltage of the MOSFET N1. The input voltage $V_{IN}$ defines the amount of the bitline voltage $V_{BL}$.

The MOSFETs P1 and P2 are preferably matched transistors with equal dimensions (same width to length ratio).

FIG. 13 shows a timing diagram of various signals at the circuit of FIG. 12.

An address change may trigger a start of a read operation. The read operation comprises two phases: a sample phase 1302 and a sense phase 1304.

Sample Phase:

At a time 1301 the switch S1 is closed and the switch S2 is opened. This corresponds to a start of the sample phase 1302.

During the sample phase, the bitline is charged to a low voltage $V_{BL,l}$. A sampled current $I_{SAMPLE}$ flowing from the drain of the MOSFET P1 towards the node 1202 increases to $I_{cell}$.

The MOSFET P1 is in diode configuration. The gate-source voltage $V_{GS,P1}$ of the MOSFET P1 corresponds to the current $I_{cell,l}$ which equals the current $I_{SAMPLE}$. The gate-source voltage $V_{GS,P1}$ is applied to the capacitor C1, which is connected to gate and source terminals of P1 and P2.

The voltage $V_{out+}$ at the terminal 1203 equals a voltage $V_{out-}$ at the node 1201. Hence the cell current $I_{cell,l}$ amounts to $I_{SAMPLE}$ when the low bitline voltage $V_{BL,l}$ is applied.

Sense Phase:

At a time 1303 the switch S2 is closed and the switch S1 is opened. This corresponds to a start of the sense phase 1304.

In the sense phase, both drains of the MOSFET P1 and P2 are connected to the terminal 1203. The gate voltage of the MOSFETs P1 and P2 are now only connected to the capacitor C1, which has stored the sampled gate-source voltage $V_{GS,P1}$ during the sample phase.

Hence, the MOSFETs P1 and P2 act as a current source forcing a current amounting to 2-times $I_{SAMPLE}$ to the node 1202.

The bitline voltage is now regulated to $$V_{BL,h} = 2 \cdot V_{BL,l} - \Delta V.$$

The cell current $I_{CELL}$ for low resistive cell state changes accordingly to $$I_{cell,h'0'} = 2 \cdot I_{cell,l'0'} - \Delta I_{cell}.$$

Hence the sample current forced by the MOSFETs P1 and P2 amounts to $$2 \cdot I_{SAMPLE} = 2 \cdot I_{cell,l'0'}.$$

Hence, the node 1202 carrying the signal $V_{out+}$ is charged up by the current $$2 \cdot I_{SAMPLE} - I_{cell,h} = 2 \cdot I_{cell,l'0'} - 2 I_{cell,l'0'} + \Delta I_{cell} = \Delta I_{cell}.$$

Since $\Delta I_{cell} > 0$ $V_{out+}$ is charged by the current $\Delta I_{cell}$ towards VDD, which corresponds to a cell state 0.

If $\Delta I_{cell} < 0$ $V_{out+}$ is discharged by $\Delta I_{cell}$ towards ground which corresponds to a cell state 1.

The voltage difference $V_{out+} - V_{out-}$ may in particular be amplified by a subsequent latch comparator (not shown) to full CMOS level.

CONCLUSION, ADDITIONAL ASPECTS

Thus, a conventional sensing scheme may fail if the distributions for the state 0 and the state 1 overlap resulting in a zero read window. The approach suggested herein allows successfully reading the memory's content by utilizing the cells' resistance, in particular the linearity of the cell resistance.

Examples described herein may be utilized for various types of memory, e.g., PCRAM (phase change RAM), CBRAM (conductive bridging) or the like.

The examples suggested herein may in particular be based on at least one of the following solutions. In particular combinations of the following features could be utilized in order to reach a desired result. The features of the method could be combined with any feature(s) of the device, apparatus or system or vice versa.

A method is suggested for determining a state of a memory cell via a sense amplifier, wherein the method comprises: applying a first signal to the sense amplifier; sensing a first response; determining a reference signal based on the first signal; sensing a second response based on a second signal that is determined based on the first signal; and determining the state of the memory cell based on the second response and the reference signal.

The first signal may be a bitline voltage applied to the sense amplifier. The first response may be a cell current sensed based on this bitline voltage. The reference signal may be a current that is determined based on the first response.

For example, the second signal $V_{BL,h}$ may be determined based on the first signal $V_{BL,l}$, e.g., by a multiplication with a factor of, e.g., 2. The result of this multiplication is subtracted by a difference signal $\Delta V$. Hence, the second signal in this example results in $$V_{BL,h} = 2 \cdot V_{BL,l} - \Delta V.$$

It is another example that a second signal $V_{BL,l}$ may be determined based on the first signal $V_{BL,h}$, e.g., by a division with a factor of, e.g., 2. The result of this division is added by a difference signal $\Delta V$. Hence, the second signal in this example results in $$V_{BL,l} = \frac{V_{BL,h}}{2} + \Delta V.$$

The second signal $V_{BL,h}$ or $V_{BL,l}$ may be used for sensing the second response. This second response is used to determine the state of the memory cell.

In an embodiment, the reference signal is determined as follows:
multiplying the first response with a predetermined factor or dividing the first response by the predetermined factor.

In an embodiment, the reference signal, the first response and the second response are currents and the first signal is a voltage.

In an embodiment, the reference signal, the first response and the second response are voltages and the first signal is a current.

Hence, the reference signal may be determined by multiplying the first signal with a factor. If the first signal is a voltage, this results also in a voltage. Due to the Ohm's law, the reference signal at this voltage equals the first response also multiplied by this factor. This reference signal is used for comparison purposes, i.e. to determine whether the cell is in the state 0 or in the state 1.

It is noted that the multiplication with a factor c may also be a multiplication with a factor 1/c resulting in a division by the factor c.

The state of the memory cell can be determined based on this second response. The second response may for this purpose be compared with the reference signal or any signal that may be based on the reference signal. The result of the comparison may reveal the actual state of the memory cell.

In an embodiment, the method further comprises: applying the second signal to the sense amplifier; and sensing the second response.

The second signal can be externally applied to the sense amplifier or it may be internally (e.g., by the sense amplifier or an associated circuitry) generated and used to sense the second response.

In an embodiment, the method further comprises: determining the second signal based on the first signal multiplied by a predetermined factor, wherein the result of the multiplication is subtracted by a difference signal.

In an embodiment, the difference signal is determined such that the reference signal at the second signal substantially shows equal distances to the state 0 and the state 1.

In an embodiment, the method further comprises: determining the second signal based on the first signal divided by a predetermined factor, wherein a difference signal is added to the result of the division.

In an embodiment, the difference signal is determined such that the reference signal at the second signal substantially shows equal distances to the state 0 and the state 1.

It is in particular an option that the reference signal is determined as a high bitline voltage based on the low bitline voltage (first signal) multiplied by the factor (e.g., 2) subtracted with the difference signal as follows:

$$V_{BL,h} = 2 \cdot V_{BL,l} - \Delta V.$$

Accordingly, the reference signal may be determined as a low bitline voltage based on the high bitline voltage (first signal) divided by a constant (e.g., 2) added by the difference signal as follows:

$$V_{BL,l} = \frac{V_{BL,h}}{2} + \Delta V.$$

It is noted that the first signal and the second signal may be voltages, in particular bitline voltages and the first response, the second response and the reference signal are currents, in particular cell currents. The cell current and the bitline voltage are linked via Ohm's law, i.e. by the resistance of the memory cell, which may be different depending on the state the memory cell is in.

It is also an option that the first signal and the second signal are (cell) currents and the first response, the second response and the reference signal are (bitline) voltages. Hence, the dual approach exchanging currents and voltages which are linked by the cell resistances, applies accordingly.

In an embodiment, the method further comprises: determining the state of the memory cell by comparing the second response with the reference signal, wherein a first state of the memory cell is determined if the second response is below the reference signal and a second state of the memory cell is determined if the second response is larger than the reference signal.

In an embodiment, the first signal is a voltage applied to a bitline that is connected to the memory cell.

In an embodiment, the memory cell is a memory cell of a non-volatile memory.

In an embodiment, the differential read memory comprises at least one of the following: floating gate cells, PCRAM, RRAM, MRAM, MONOS devices, nano crystal cells, and ROM.

Also, a memory device is provided, said memory device comprising at least one memory cell, wherein the memory device is arranged to apply a first signal to the sense amplifier; sense a first response; determine a reference signal based on the first signal; sense a second response based on a second signal that is determined based on the first signal; and determine the state of the memory cell based on the second response and the reference signal.

In an embodiment, the memory device is further arranged to apply the second signal to the sense amplifier.

In an embodiment, the memory cell is a memory cell of a non-volatile memory.

In an embodiment, the differential read memory comprises at least one of the following: floating gate cells, PCRAM, RRAM, MRAM, MONOS devices, nano crystal cells, and ROM.

Further, a device is provided for data processing, in particular for determining a state of at least one memory cell, comprising: means for applying a first signal to the sense amplifier; means for sensing a first response; means for determining a reference signal based on the first signal; means for sensing a second response based on a second signal that is determined based on the first signal; and means for determining the state of the memory cell based on the second response and the reference signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for determining a state of a memory cell via a sense amplifier, the method comprising the following steps (a) through (e) in the order named:
   (a) applying a first sense signal to a bitline of the memory cell via the sense amplifier;
   (b) sensing a first response signal of the memory cell;
   (c) determining a reference signal based on the first sense signal;
   (d) sensing a second response signal of the memory cell based on a second sense signal, which is applied to the bitline of the memory cell via the sense amplifier and is determined based on the first sense signal; and
   (e) determining the state of the memory cell based on the second response signal and the reference signal.

2. The method according to claim 1, wherein the reference signal is determined as follows:

multiplying the first response signal with a predetermined factor or dividing the first response signal by the predetermined factor.

3. The method according to claim 2, wherein the reference signal, the first response signal and the second response signal are currents and the first sense signal is a voltage.

4. The method according to claim 2, wherein the reference signal, the first response signal and the second response signal are voltages and the first sense signal is a current.

5. The method according to claim 1, further comprising: determining the second sense signal based on the first signal multiplied by a predetermined factor, wherein the result of the multiplication is subtracted by a difference signal wherein the difference signal is determined such that the reference signal at the second sense signal substantially shows predetermined distances to the state 0 and the state 1 respectively.

6. The method according to claim 5, wherein the difference signal is determined such that the reference signal at the second signal substantially shows equal distances to the state 0 and the state 1.

7. The method according to claim 1, further comprising: determining the second sense signal based on the first sense signal divided by a predetermined factor, wherein a difference signal is added to the result of the division.

8. The method according to claim 7, wherein the difference signal is determined such that the reference signal at the second sense signal substantially shows equal distances to the state 0 and the state 1.

9. The method according to claim 1, further comprising: determining the state of the memory cell by comparing the second response signal with the reference signal, wherein a first state of the memory cell is determined if the second response signal is below the reference signal and a second state of the memory cell is determined if the second response signal is larger than the reference signal.

10. The method according to claim 1, wherein the first sense signal is a voltage applied to a bitline that is connected to the memory cell.

11. The method according to claim 1, wherein the memory cell is a memory cell of a non-volatile memory.

12. The method according to claim 1, wherein the memory cell is comprised within at least one of the following: floating gate cells, PCRAM, RRAM, MRAM, MONOS devices, nano crystal cells, and ROM.

13. A memory device comprising at least one memory cell, wherein the memory device is arranged to perform the following, actions (a) through (et) in the order named:
    (a) apply a first sense signal to a bitline of the memory cell via a sense amplifier;
    (b) sense a first response signal of the memory cell;
    (c) determine a reference signal based on the first sense signal;
    (d) sense a second response signal of the memory cell based on a second sense signal, which is applied to the bitline of the memory cell via the sense amplifier and is determined based on the first sense signal; and
    (e) determine the state of the memory cell based on the second response signal and the reference signal.

14. The memory device according to claim 13, wherein the memory device is further arranged to:
    apply the second sense signal to the sense amplifier.

15. The memory device according to claim 13, wherein the memory cell is a memory cell of a non-volatile memory.

16. The memory device according to claim 13, wherein the memory cell is comprised within at least one of the following: floating gate cells, PCRAM, RRAM, MRAM, MONOS devices, nano crystal cells, and ROM.

17. A device for determining a state of at least one memory cell, comprising the following means (a) through (e) to function in the order named:
    (a) means for applying a first sense signal to a bitline of the at least one memory cell via a sense amplifier;
    (b) means for sensing a first response signal of the at least one mentors, cell;
    (c) means for determining a reference signal based on the first sense signal;
    (d) means for sensing a second response signal of the at least one memory cell based on a second sense signal, which is applied to the bitline of the at least one memory cell via the sense amplifier and is determined based on the first sense signal; and
    (e) means for determining the state of the memory cell based on the second response signal and the reference signal.

* * * * *

UNITED STATES PATENT AND TRADEMARK OFFICE
CERTIFICATE OF CORRECTION

PATENT NO. : 10,236,041 B2
APPLICATION NO. : 15/597846
DATED : March 19, 2019
INVENTOR(S) : Mihail Jefremow et al.

Page 1 of 1

It is certified that error appears in the above-identified patent and that said Letters Patent is hereby corrected as shown below:

In the Claims

At Column 12, Claim number 17, Line number 32, please delete "mentors" and insert --memory--.

Signed and Sealed this
Twenty-third Day of April, 2019

Andrei Iancu
*Director of the United States Patent and Trademark Office*